US010780516B2

(12) United States Patent
Dautenhahn et al.

(10) Patent No.: US 10,780,516 B2
(45) Date of Patent: Sep. 22, 2020

(54) WAVE SOLDER NOZZLE WITH AUTOMATED ADJUSTABLE SLIDING PLATE TO VARY SOLDER WAVE WIDTH

(71) Applicant: Illinois Tool Works Inc., Glenview, IL (US)

(72) Inventors: Jonathan M. Dautenhahn, Camdenton, MO (US); Gregory Leo Hueste, Camdenton, MO (US)

(73) Assignee: Illinois Tool Works Inc., Glenview, IL (US)

( * ) Notice: Subject to any disclaimer, the term of this patent is extended or adjusted under 35 U.S.C. 154(b) by 202 days.

(21) Appl. No.: 16/008,382

(22) Filed: Jun. 14, 2018

(65) Prior Publication Data

US 2019/0381590 A1  Dec. 19, 2019

(51) Int. Cl.
| | | |
|---|---|---|
| *B23K 1/00* | (2006.01) | |
| *B23K 1/08* | (2006.01) | |
| *B23K 3/06* | (2006.01) | |
| *H05K 3/34* | (2006.01) | |

(52) U.S. Cl.
CPC ............ *B23K 1/085* (2013.01); *B23K 3/0653* (2013.01); *H05K 3/3468* (2013.01)

(58) Field of Classification Search
CPC .... B23K 1/085; B23K 3/0653; H05K 3/3468; H05K 3/34
USPC ..................................... 228/33, 37, 256, 260
See application file for complete search history.

(56) References Cited

U.S. PATENT DOCUMENTS

| | | | |
|---|---|---|---|
| 3,151,592 A | 10/1964 | Wegener | |
| 3,604,611 A | 9/1971 | Lamberty | |
| 3,993,235 A | 11/1976 | Boynton | |
| (Continued) | | | |

FOREIGN PATENT DOCUMENTS

| | | | |
|---|---|---|---|
| EP | 0377336 A2 * | 7/1990 | ............. B23K 1/085 |
| JP | 63242466 A * | 10/1988 | ........... B23K 3/0646 |
| (Continued) | | | |

OTHER PUBLICATIONS

Notification of Transmittal of the International Search Report and the Written Opinion of the International Searching Authority from corresponding PCT/US2019/033791 dated Oct. 9, 2019.

(Continued)

*Primary Examiner* — Kiley S Stoner
(74) *Attorney, Agent, or Firm* — Lando & Anastasi, LLP

(57) ABSTRACT

A wave soldering machine includes a housing and a conveyor configured to deliver a printed circuit board through the housing. The wave soldering machine further includes a wave soldering station coupled to the housing. The wave soldering station includes a reservoir of solder material, and a wave solder nozzle assembly configured to create a solder wave. The wave solder nozzle assembly has a nozzle core frame, a solder distribution baffle secured to the nozzle core frame, and a sliding plate that together define a nozzle. The sliding plate is movable with respect to the nozzle core frame between a close proximate position in which the nozzle is configured to produce a reduced width solder wave through the solder distribution baffle and a spaced apart position in which the nozzle is configured to produce an extended width solder wave through the solder distribution baffle.

10 Claims, 7 Drawing Sheets

(56) References Cited

U.S. PATENT DOCUMENTS

| | | | |
|---|---|---|---|
| 4,447,001 A * | 5/1984 | Allen | B23K 3/0653 228/37 |
| 4,465,219 A | 8/1984 | Kondo | |
| 4,530,457 A | 7/1985 | Down | |
| 4,530,458 A * | 7/1985 | Kondo | B23K 3/0653 228/180.1 |
| 4,666,077 A | 5/1987 | Rahn et al. | |
| 4,824,010 A | 4/1989 | Inoue et al. | |
| 4,848,642 A * | 7/1989 | Kondo | B23K 3/0653 228/37 |
| 4,886,201 A * | 12/1989 | Deambrosio | B23K 3/0653 228/37 |
| RE33,197 E * | 4/1990 | Deambrosio | B23K 3/0653 228/180.1 |
| 5,044,542 A | 9/1991 | Deambrosio | |
| 5,121,874 A | 6/1992 | Deambrosio et al. | |
| 5,156,324 A | 10/1992 | Hueste et al. | |
| 5,409,159 A * | 4/1995 | Connors | B23K 3/0653 228/219 |
| 5,411,197 A * | 5/1995 | Nakamura | B23K 3/0653 228/34 |
| 5,568,894 A | 10/1996 | Gileta | |
| 5,630,542 A | 5/1997 | Hendrikx | |
| 5,772,101 A * | 6/1998 | Nishimura | B23K 3/0653 228/260 |
| 5,794,837 A * | 8/1998 | Cottingham | B23K 3/0653 118/410 |
| 6,119,915 A * | 9/2000 | Thompson, Sr. | B23K 3/087 118/429 |
| 6,415,972 B1 | 7/2002 | Leap | |
| 6,431,431 B2 | 8/2002 | Willis et al. | |
| 6,499,650 B2 | 12/2002 | Takano et al. | |
| 6,726,083 B2 | 4/2004 | Leap | |
| 6,732,903 B2 | 5/2004 | Wang et al. | |
| 7,988,031 B2 * | 8/2011 | Nakamura | B23K 1/0016 228/42 |
| 9,022,275 B2 | 5/2015 | Hsieh | |
| 9,161,459 B2 | 10/2015 | Dautenhahn | |
| 9,198,300 B2 | 11/2015 | Dautenhahn | |
| 9,370,838 B2 | 6/2016 | Hueste | |
| 9,427,819 B2 | 8/2016 | Dautenhahn | |
| 2001/0020637 A1 * | 9/2001 | Zen | B23K 3/0653 228/260 |
| 2002/0036223 A1 * | 3/2002 | Saito | B23K 3/0653 228/37 |
| 2003/0116607 A1 * | 6/2003 | Wang | B23K 3/0653 228/37 |
| 2004/0211816 A1 * | 10/2004 | Ogawa | B23K 1/085 228/37 |
| 2005/0006435 A1 * | 1/2005 | Diehm | B23K 3/0653 228/37 |
| 2006/0186183 A1 | 8/2006 | Morris | |
| 2010/0065610 A1 * | 3/2010 | Szymanowski | B23K 1/0016 228/37 |
| 2010/0163599 A1 * | 7/2010 | Zen | B23K 1/085 228/37 |
| 2011/0226843 A1 * | 9/2011 | Yanaros | B23K 1/203 228/260 |
| 2013/0206817 A1 | 8/2013 | Tavares et al. | |
| 2017/0072492 A1 * | 3/2017 | Hashimoto | B23K 3/0653 |
| 2018/0111211 A1 * | 4/2018 | Dautenhahn | H05K 3/34 |
| 2019/0039159 A1 * | 2/2019 | Suzuki | B23K 3/082 |

FOREIGN PATENT DOCUMENTS

| | | |
|---|---|---|
| JP | 2006080439 A | 3/2006 |
| WO | 2015040691 A1 | 3/2015 |

OTHER PUBLICATIONS

Dietrich, Aaron, "How electric linear actuators improve automation results", Feb. 17, 2015, http://blog.tolomatic.com/bid/77545/how-electric-linear-actuators-improve-automation-results.

\* cited by examiner

WAVE SOLDER NOZZLE WITH AUTOMATED ADJUSTABLE SLIDING PLATE TO VARY SOLDER WAVE WIDTH

BACKGROUND OF DISCLOSURE

1. Field of Disclosure

The present disclosure relates generally to apparatus and methods for manufacturing printed circuit boards and for assisting a process of soldering metals to integrated circuit boards, and more particularly to a wave soldering machine and related method having a wave solder nozzle assembly having an automated adjustable sliding plate to vary solder wave width.

2. Discussion of Related Art

In the fabrication of printed circuit boards, electronic components can be mounted to a printed circuit board by a process known as "wave soldering." In a typical wave solder machine, a printed circuit board (sometimes referred to as a "PCB") is moved by a conveyor on an inclined path past a fluxing station, a pre-heating station, and finally a wave soldering station. At the wave soldering station, a wave of solder is caused to well upwardly (by means of a pump) through a wave solder nozzle and contact portions of the printed circuit board to be soldered.

Typical wave solder nozzles have a fixed width for applying solder to the bottom side of the printed circuit board. This results in a fixed solder contact length as a PCB passes over the solder wave. Recently, wave solder machines having split conveyors are available to customers. A typical wave solder machine having a split conveyor includes fluxing station, one or more pre-heating stations, a wave soldering station, and a cooling station. A wave solder machine having a split conveyor can be configured to include a first conveyor section that travels through the fluxing station and the pre-heating stations, a second conveyor section that travels through the wave soldering station, a third conveyor section that travels from an end of the wave soldering station to the cooling station, and a fourth conveyor section that extends through the remainder of the cooling section. The first conveyor section and the fourth conveyor section carry PCBs along a common, relatively horizontal plane. The split conveyor includes a first transition point between the first conveyor section and the second conveyor section. The second conveyor section extends along an inclined path (e.g., six degrees with respect to horizontal) through the wave soldering station. The third conveyor section extends along a decline path to the fourth conveyor section.

As mentioned above, an advantage of the wave solder machine having the split conveyor is to maintain different processing speeds between the fluxing station and the pre-heating stations versus the wave soldering station. The split conveyor allows for different conveyor speeds through the solder wave, thus providing the ability to change the solder contact time (sometimes referred to as the "dwell time"). The dwell time adjustment can be very important in the optimization of soldering characteristics when an operator processes a vast array of products.

One disadvantage associated with the wave solder machine having the split conveyor configuration is the cost of the machine, as well as the repeatability and reliability of the resulting wave soldering process. Another disadvantage is that the reliability of the split conveyor drive components is compromised due to the harsh environment in which they operate. Yet another disadvantage of split conveyors is that multiple transition points along the conveyor provide many opportunities for PCB mishandling and/or dropping.

As stated above, solder dwell time is a critical process parameter for optimizing soldering characteristics. The many varieties of size, mass, shape, composition, etc. of the PCB push the envelope of process windows; thus, a "one size fits all" approach to dwell time is not always the most effective. A soldering process that is not effectively optimized can lead to soldering defects that result in rework or scrap.

SUMMARY OF DISCLOSURE

One aspect of the disclosure is directed to a wave soldering machine to perform a wave soldering operation on a printed circuit board. In one embodiment, the wave soldering machine comprises a housing and a conveyor coupled to the housing. The conveyor is configured to deliver a printed circuit board through the housing. The wave soldering machine further comprises a wave soldering station coupled to the housing. The wave soldering station includes a reservoir of solder material, and a wave solder nozzle assembly configured to create a solder wave. The wave solder nozzle assembly has a nozzle core frame, a solder distribution baffle secured to the nozzle core frame, and a sliding plate that together define a nozzle. The sliding plate is movable with respect to the nozzle core frame between a close proximate position in which the nozzle is configured to produce a reduced width solder wave through the solder distribution baffle and a spaced apart position in which the nozzle is configured to produce an extended width solder wave through the solder distribution baffle.

Embodiments of the wave soldering machine further may include configuring the wave solder nozzle assembly to further include an unload support frame secured to the nozzle core frame. The wave solder nozzle assembly further may include an actuating support frame coupled to the unload support frame and configured to move relative to the unload support frame, with the sliding plate being secured to the actuating support frame. The wave solder nozzle assembly further may include V-shaped wheels secured to the actuating support frame and V-grooved blocks secured to the unload support frame, with the V-shaped wheels being received within the V-grooved blocks to provide relative movement of the actuating support frame with respect to the unload support frame. The wave solder nozzle assembly further may include an actuator assembly configured to move the actuating support frame. The actuator assembly may include an actuator support secured to the reservoir and an actuator secured to and supported by the actuator support. The actuator assembly further may include a connecting link secured to the actuating support frame and coupled to the actuator. The actuator may be coupled to a controller to control the movement of the actuator.

Another aspect of the disclosure is directed to a wave solder nozzle assembly of a wave soldering station configured to perform a wave soldering operation on a printed circuit board. In one embodiment, the wave solder nozzle assembly comprises a nozzle core frame, a solder distribution baffle secured to the nozzle core frame, and a sliding plate, which with the nozzle core frame and the solder distribution baffle together define a nozzle. The sliding plate is movable with respect to the nozzle core frame between a close proximate position in which the nozzle is configured to produce a reduced width solder wave through the solder distribution baffle and a spaced apart position in which the nozzle is configured to produce an extended width solder wave through the solder distribution baffle.

Embodiments of the wave solder nozzle assembly further may include an unload support frame secured to the nozzle core frame. The wave solder nozzle assembly further may include an actuating support frame coupled to the unload support frame and configured to move relative to the unload support frame, the sliding plate being secured to the actuating support frame. The wave solder nozzle assembly further may include V-shaped wheels secured to the actuating support frame and V-grooved blocks secured to the unload support frame, with the V-shaped wheels being received within the V-grooved blocks to provide relative movement of the actuating support frame with respect to the unload support frame. The wave solder nozzle assembly further may include an actuator assembly configured to move the actuating support frame. The actuator assembly may include an actuator support secured to the reservoir and an actuator secured to and supported by the actuator support. The actuator assembly further may include a connecting link secured to the actuating support frame and coupled to the actuator. The actuator may be coupled to a controller to control the movement of the actuator.

Yet another aspect of the disclosure is directed to a method of adjusting a width of a solder wave of a wave solder nozzle assembly of a wave soldering machine. In one embodiment, the method comprises: delivering solder material to a wave solder nozzle assembly including a solder distribution baffle; adjusting a width of a solder wave with the wave solder nozzle assembly with a sliding plate movable with respect to the solder distribution baffle; and performing a wave soldering operation on a printed circuit board.

Embodiments of the method further may include adjusting a width of a solder wave by moving the sliding plate of the wave solder nozzle assembly with respect to a nozzle core frame supporting the solder distribution baffle between a close proximate position to produce a reduced width solder wave through the solder distribution baffle and a spaced apart position to produce an extended width solder wave through the solder distribution baffle. The movement of the sliding plate may be achieved by an actuator assembly configured to move an actuating support frame coupled to the sliding plate. The actuator may be coupled to a controller to control the movement of the actuator.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
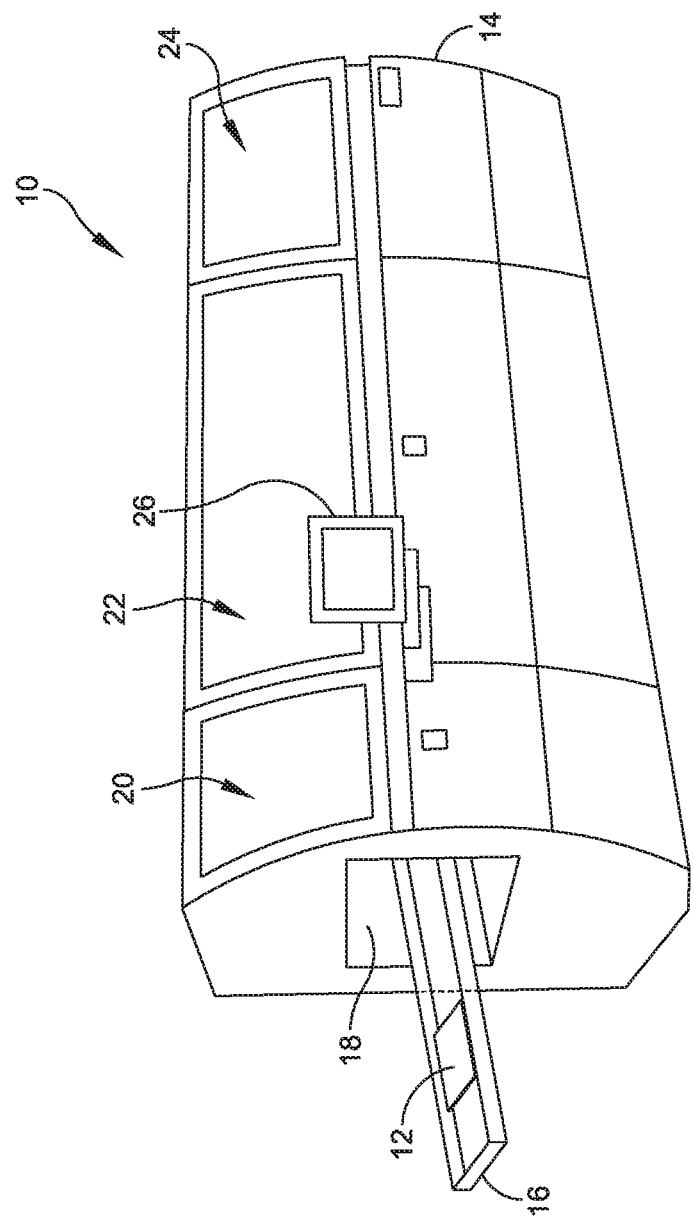
FIG. 1 is a perspective view of a wave solder machine.

This disclosure is not limited in its application to the details of construction and the arrangement of components set forth in the following description or illustrated in the drawings. The disclosure is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

As mentioned above, the downsides of the split conveyor concept are cost, repeatability, and reliability. Embodiments of the present disclosure are directed to an automated adjustable sliding plate to adjust the nozzle wave width in order to vary the contact length, thus varying the solder dwell time without having to change conveyor speeds. One objective is to provide the ability to adjust the solder dwell time without changing the conveyor speed. An additional objective is to automate this adjustment and allow for computer control to eliminate the need for human intervention when adjustment is needed based on the product being processed.

For purposes of illustration, and with reference to FIG. 1, embodiments of the present disclosure will now be described with reference to a wave solder machine, generally indicated at 10, which is used to perform a solder application on a printed circuit board 12. The wave solder machine 10 is one of several machines in a printed circuit board fabrication/assembly line. As shown, the wave solder machine 10 includes a housing or frame 14 adapted to house the components of the machine. The arrangement is such that a conveyor 16 delivers printed circuit boards to be processed by the wave solder machine 10. Upon entering the wave solder machine 10, each printed circuit board 12 travels along an inclined path (e.g., six degrees with respect to horizontal) along the conveyor 16 through a tunnel 18, which includes a fluxing station, generally indicated at 20, and a pre-heating station, generally indicated at 22, to condition the printed circuit board for wave soldering. Once conditioned (i.e., heated), the printed circuit board 12 travels to a wave soldering station, generally indicated at 24, to apply solder material to the printed circuit board. A controller 26 is provided to automate the operation of the several stations of the wave solder machine 10, including but not limited to the fluxing station 20, the pre-heating station 22, and the wave soldering station 24, in the well known manner.

Figure 2:
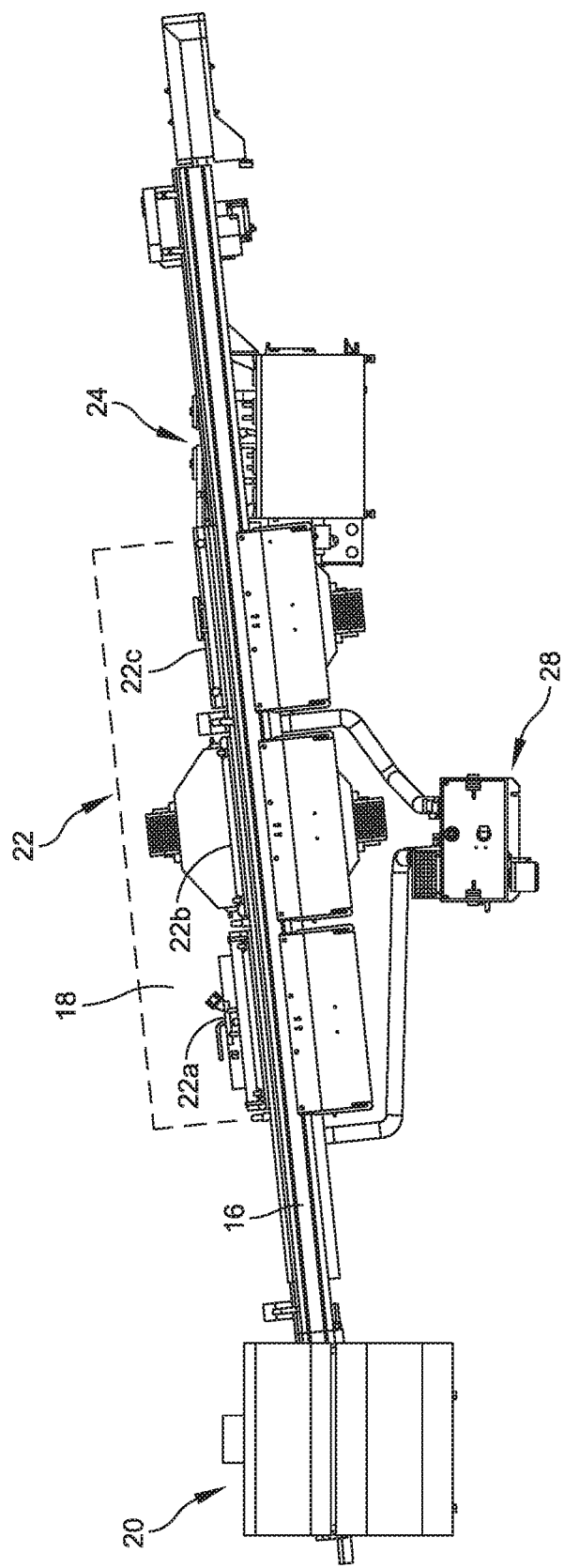
FIG. 2 is a side elevational view of the wave solder machine with external packaging removed to reveal internal components of the wave solder machine.

Referring to FIG. 2, the fluxing station 20 is configured to apply flux to the printed circuit board as it travels on the conveyor 16 through the wave solder machine 10. The pre-heating station includes several pre-heaters (e.g., pre-heaters 22a, 22b and 22c), which are designed to incrementally increase the temperature of the printed circuit board as it travels along the conveyor 16 through the tunnel 18 to prepare the printed circuit board for the wave soldering process. As shown and described in greater detail below, the wave soldering station 24 includes a wave solder nozzle assembly in fluid communication with a reservoir of solder material. A pump is provided within the reservoir to deliver molten solder material to the wave solder nozzle assembly from the reservoir. Once soldered, the printed circuit board exits the wave solder machine 10 via the conveyor 16 to another station provided in the fabrication line, e.g., a pick-and-place machine.

In some embodiments, the wave solder machine 10 further may include a flux management system, generally indicated at 28, to remove volatile contaminants from the tunnel 18 of the wave solder machine. As shown in FIG. 2, the flux management system 28 is positioned below the pre-heating station 22. In one embodiment, the flux management system is supported by the housing 14 within the wave solder machine, and is in fluid communication with the tunnel 18, which is schematically illustrated in FIG. 2. The flux management system 28 is configured to receive contaminated gas from the tunnel 18, treat the gas, and return clean gas back to the tunnel. The flux management system 28 is particularly configured to remove volatile contaminants from the gas, especially in inert atmospheres.

Figure 3:
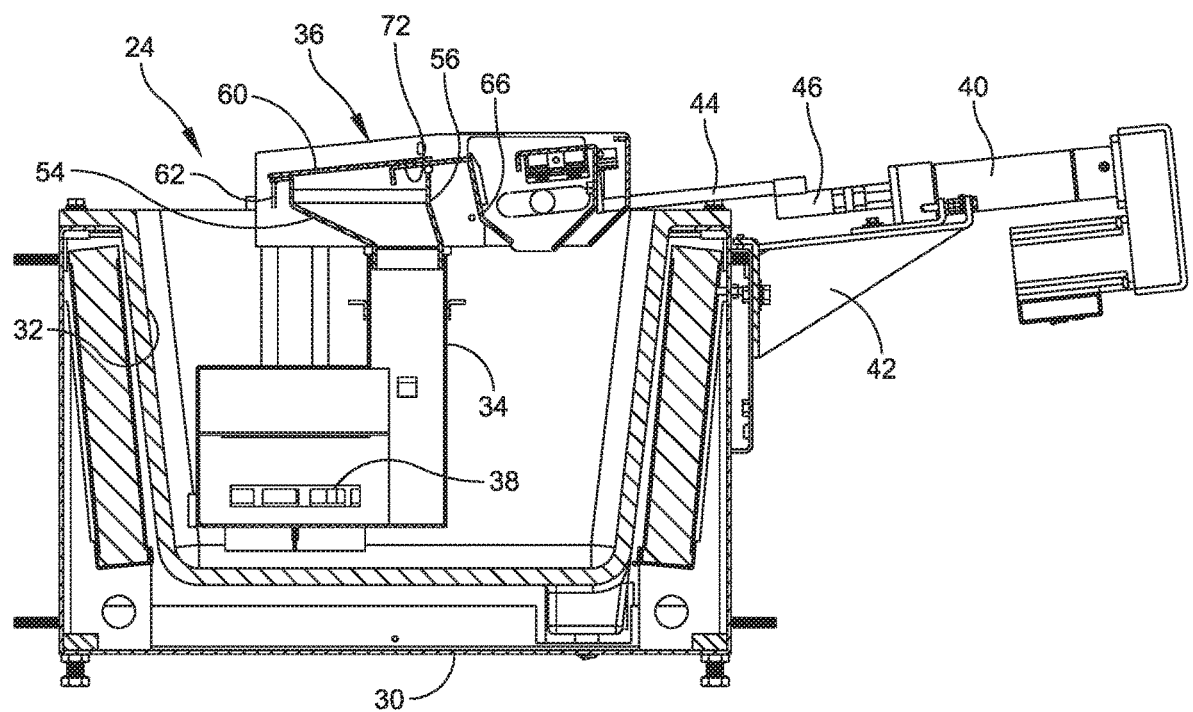
FIG. 3 is a schematic cross-sectional view of the wave soldering station.
Figure 4:
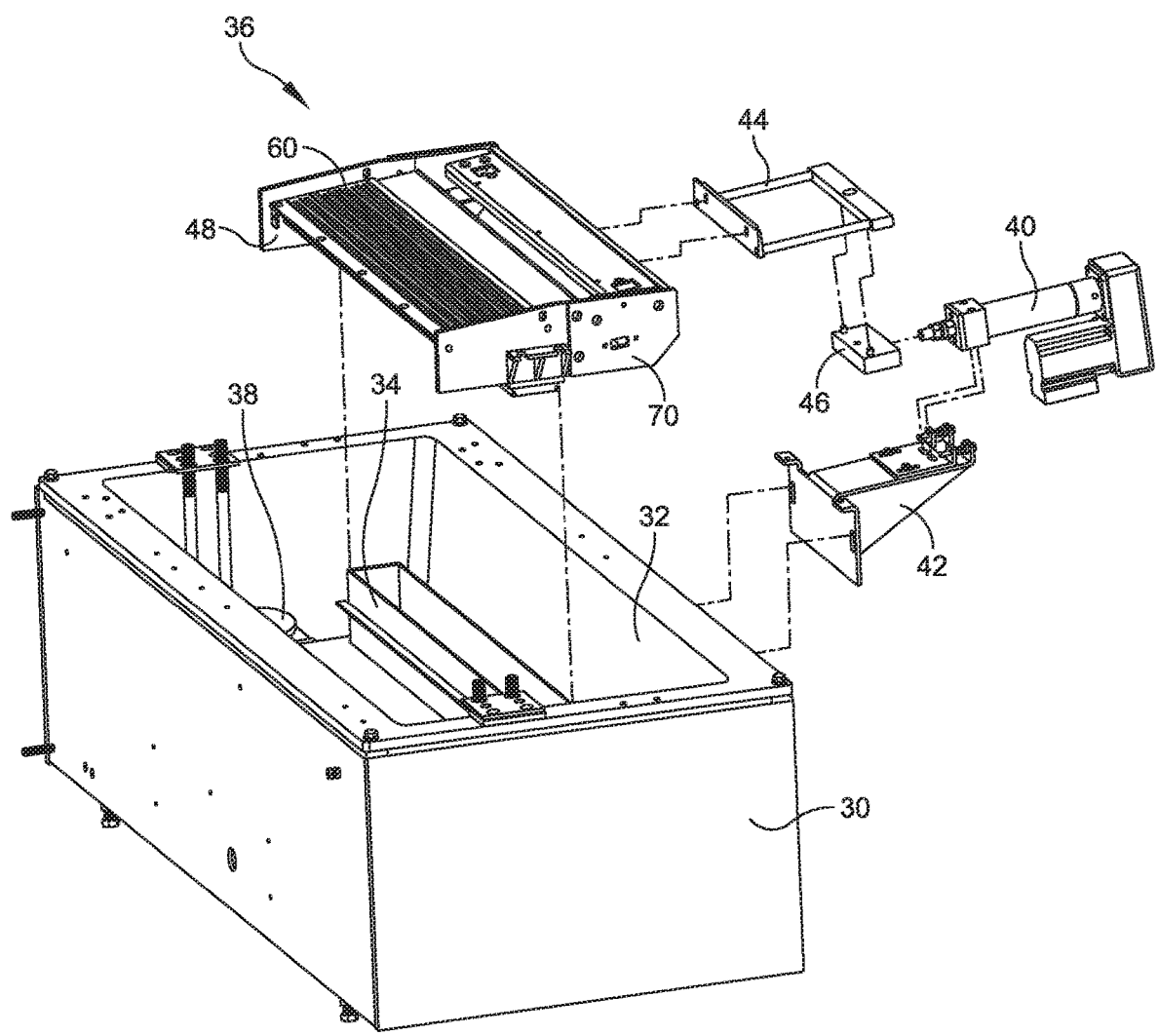
FIG. 4 is an exploded perspective view of the wave soldering station.

Referring to FIGS. 3 and 4, in one embodiment, the wave soldering station 24 includes a solder pot 30 that defines a reservoir 32 configured to contain molten solder. In one embodiment, the solder pot 30 is a box-shaped structure that supports the components of the wave soldering station 24 including a flow duct 34 having two chambers within the reservoir 32. The flow duct 34 is designed to deliver pressurized molten solder to an opening or nozzle of a wave solder nozzle assembly, which is generally indicated at 36. As will be described in greater detail below, the wave solder nozzle assembly 36 is configured to channel the molten solder to the bottom of the printed circuit board 12 and provides for smooth flow of solder back into the reservoir 32. Specifically, the wave solder nozzle assembly 36 is capable of adjusting a height and a width of the solder wave when performing a wave solder operation.

The wave soldering station 24 further includes a pump impeller 38 positioned within the reservoir 32 of the solder pot 30 adjacent an inlet provided in the flow duct 34. The pump impeller 38 pressurizes the molten solder in the reservoir 32 to pump the molten solder vertically within the reservoir to the wave solder nozzle assembly 36. In one embodiment, the pump impeller 38 is a centrifugal pump that is suitably sized to pump the molten solder to the nozzle of the wave solder nozzle assembly 36. The wave solder nozzle assembly 36 is configured to generate a solder wave that is provided to attach components on the circuit board 12 in the manner described below, and to optimize a dwell time during processing.

Figure 5:
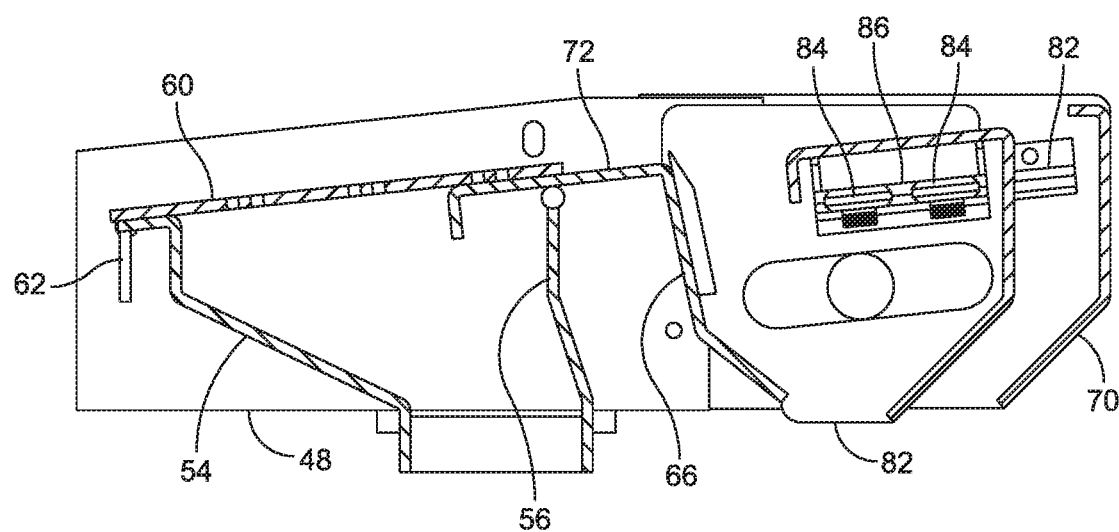
FIG. 5 is an enlarged schematic cross-sectional view of an adjustable nozzle assembly of the wave soldering station.

The wave solder nozzle assembly 36 is coupled to an actuator 40 to adjust a width of the solder wave during a wave solder operation as viewed in FIG. 5 to increase or decrease a contact length of the solder wave. The actuator 40 is secured to the solder pot 30 by an actuator support frame 42, which is secured to a side wall of the solder pot by suitable fasteners, such as bolts. The actuator support frame 42 could alternately be secured to the solder pot 30 by another method, such as welding. As shown, the actuator 40 is secured to the actuator support frame 42, which is configured to support the actuator firmly relative to the solder pot 30. The actuator 40 is positioned next to the wave solder nozzle assembly 36 and forms part of the assembly to adjust the nozzle of the wave solder nozzle assembly by a connecting link 44, which is coupled to the actuator by an actuator block 46 thereby providing movement to adjust a nozzle opening width of the wave solder nozzle assembly.

The actuator block 46 connects the actuator 40 to the connecting link 44 to transfer movement from the actuator to the connecting link. In certain embodiments, the actuator 40 includes an electromechanical actuator that provides movement for the adjustment of the nozzle opening width. The actuator 40 is driven by computer controlled machine software (supported by the controller 26) and incorporates an encoder that can relay position indication to the machine software.

Figure 6:
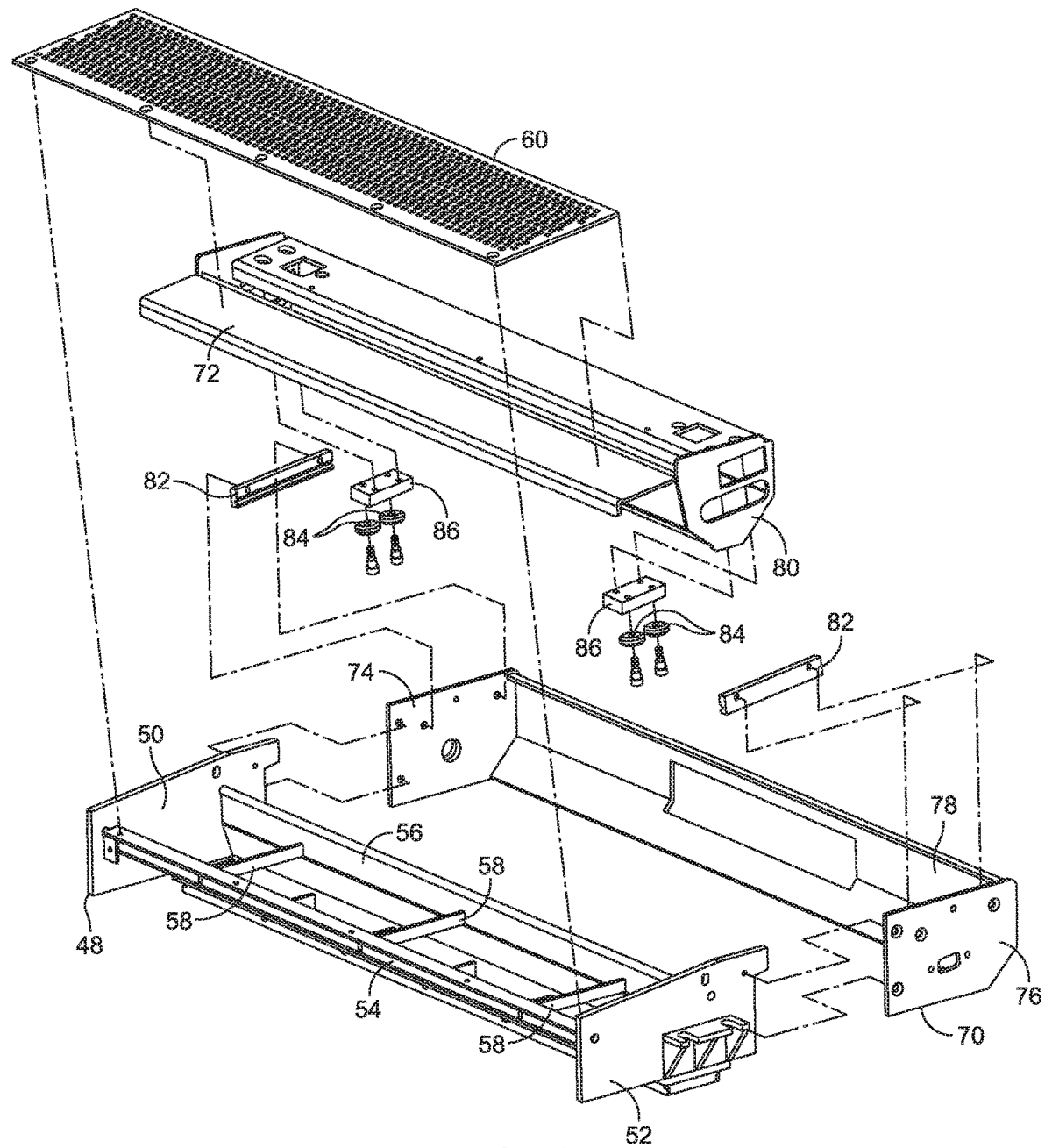
FIG. 6 is an exploded perspective view of the adjustable nozzle assembly.

Referring to FIGS. 5 and 6, the wave solder nozzle assembly 36 includes a nozzle core frame 48 having two side walls 50, 52, a first longitudinal support element 54 and a second longitudinal support element 56 that extends between the side walls. As shown, the nozzle core frame 48 further may include several cross support elements, each indicated at 58, that extend between the first longitudinal support element 54 and the second longitudinal support element 56. The nozzle core frame 48 also directs the solder flow through a nozzle throat defined between the first and second longitudinal support elements 54, 56. The wave solder nozzle assembly 36 further includes a solder distribution baffle or nozzle plate 60 that is secured to the first and second longitudinal support elements 54, 56 of the nozzle core frame 48. In one embodiment, one side, i.e., the load side 62, of the solder distribution baffle 60 is secured to or formed integrally with the first longitudinal support element 54, and the other side, i.e., the unload side 66, of the solder distribution baffle is secured to or integrally formed with the second longitudinal support element 56. The baffle 60 is secured to the first longitudinal support element 54 with screws, e.g., through five openings located at the load side of the baffle.

In one embodiment, the solder distribution baffle 60 includes a unique pattern of square holes. The unique hole pattern design incorporated into the solder distribution baffle produces an even, parallel wave across the entire solder contact area (e.g., five inches) while maintaining a six-degree liquid, molten solder plane that is parallel with the six-degree plane of the conveyor 16 conveying the circuit board 12. The range of contact length of such system is approximately 3½ inches at a minimum to 5½ inches at a maximum length. As shown, the solder distribution baffle 60 is secured to the nozzle core frame 48 in a position in which the solder distribution baffle maintains a six-degree liquid, molten solder plane that is parallel with a six-degree plane of the conveyor system 16 conveying the circuit board 12. The width of the solder wave can be controlled in the manner described below. A flow gate may be provided to block solder flow from escaping from underneath the second longitudinal support element 56 of the nozzle core frame 48.

The wave solder nozzle assembly 36 further includes an unload support frame 70, which provides a fixed structure to support the components of a movement mechanism to change the width of the solder distribution baffle 60 by means of a movable sliding plate 72. The unload support frame 70 includes two side walls 74, 76 and a longitudinal support 78 that extends between the side walls. The movement mechanism includes an actuating support frame 80 that is secured to and supported by the unload support frame 70, and is configured to move relative to the unload support frame. The sliding plate 72 is secured to the actuating support frame 80 by suitable fasteners, such a bolt fasteners, or by welding, for example.

Since the top surface of the first longitudinal support element 54 is on the same plane as the top surface of the sliding plate 72, the screws at the load end of the solder distribution baffle 60 apply enough downward pressure to maintain contact of the sliding plate with both the solder distribution baffle 60 and the second longitudinal support element 56. The sliding plate 72 moves freely between the solder distribution baffle 60 and the second longitudinal support element 56. Thus, no additional hardware is used to secure the solder distribution baffle 60 or the sliding plate 72 to the second longitudinal support element 56.

Specifically, the movement mechanism includes two V-grooved blocks, each indicated at 82, which are secured to respective side walls of the unload support frame 70. Each V-grooved block 82 is configured to engage a pair of V-shaped wheels, each indicated at 84, which enable the actuating support frame 80 to move relative to the unload support frame 70. Although two V-shaped wheels 84 are shown and described in FIGS. 5 and 6, any number of V-shaped wheels can be provided to enable the relative movement of the sliding plate 72. Each V-grooved block 82 provides centering and support for the pair of V-shaped wheels 84. Each pair of V-shaped wheels 84 is secured in place to the actuating support frame 80 by a wheel support block 86. The arrangement is such that the V-shaped wheels 84 roll against the V-grooved block 82 to provide smooth movement of actuating support frame 80, which in turn moves the sliding plate 72.

In some embodiments, the wave solder nozzle assembly 36 further includes a dross box that is secured to the nozzle frame and configured to reduce turbulence as the solder travels back to the reservoir 32, thereby reducing solder balls that can form within the reservoir. One or more nitrogen tubes can be provided to create an inert atmosphere during the wave soldering process.

Figure 7:
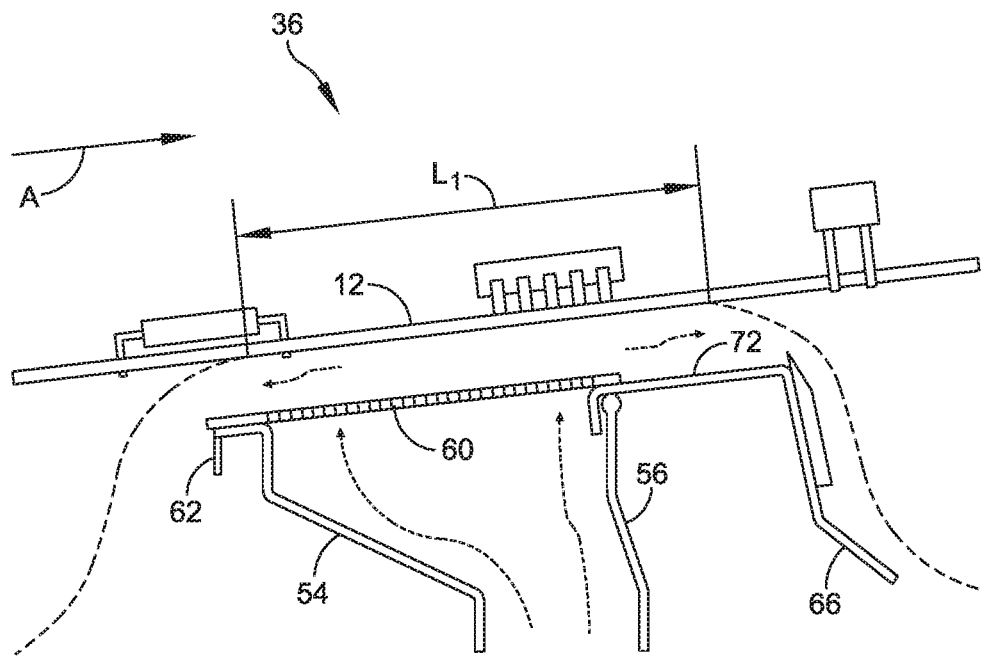
FIG. 7 is a schematic cross-sectional view of a wave soldering station of the wave solder machine having an adjustable nozzle at a maximum length.
Figure 8:
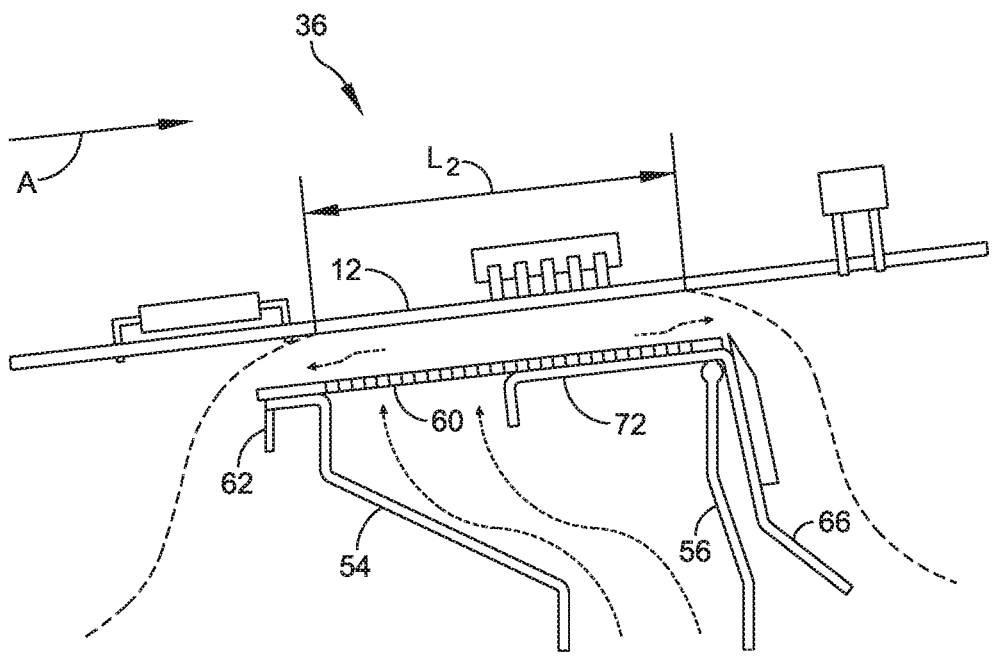
FIG. 8 is a schematic cross-section view of the wave soldering station having the adjustable nozzle at a minimum length.

Thus, the width of the solder wave is adjusted by moving the actuating support frame 80 and the sliding plate 72 with respect to the unload support frame 70 by the actuator 40 under the control of the controller 26. Referring to FIGS. 7 and 8, the printed circuit board 12 is shown traveling over the wave solder nozzle assembly 36 of the wave soldering station 24 with a direction of travel being indicated at A. As shown in FIG. 7, the circuit board 12 is traveling over the wave solder nozzle assembly 36 having a maximum contact length (designated "$L_1$" in FIG. 7) that is achieved by a relatively wide solder wave. In this position, the sliding plate 72 is positioned relatively far away from the first longitudinal support member 54 to create the relatively wide solder wave, sometimes referred to as a spaced apart position. In this spaced apart position, the sliding plate 72 forms part of the contact area of the solder wave as it travels over the unload side 66. As a result, the travel of the circuit board 12 over the solder wave is maximized.

As shown in FIG. 8, the circuit board 12 is traveling over the wave solder nozzle assembly 36 having a minimum contact length (designated "$L_2$" in FIG. 8) that is achieved by a relatively narrow solder wave. In this position, the sliding plate 72 is positioned adjacent and proximate to the first longitudinal support member 54 to create the relatively narrow solder wave, sometimes referred to as a close proximate position. As a result, the travel of the circuit board 12 over the solder wave is minimal. As described above, the maximum contact length $L_1$ is approximately 5½ and the minimum contact length $L_2$ is approximately 3½ inches. The controller 26 can position the sliding plate 72 to any position within this range to optimize contact length for any PCB.

The width of the solder wave can be adjusted on the fly during a PCB processing operation or during set up of a new PCB processing operation for different boards by controlling a movement of the actuator 40 and ultimately the sliding plate 72. The actuator 40 is driven by computer controlled machine software of the controller 26. Thus, the contact length can be dynamically changed during PCB operation.

Embodiments of the wave solder nozzle assembly 36 include varying the nozzle opening width and amount of travel. Further, the actuator 40 may embody any means of mechanical actuation, such as but not limited to an electromechanical actuator, a pneumatic actuator, a hydraulic actuator, a drive motor and lead screw assembly. The shapes and sizes of the sliding plate 72 may be varied as well. The components of the movement mechanism, including the size and shape of the V-shaped wheels 84, may be varied, or the placement of the V-shaped wheels and V-grooved blocks 82. For example, the V-shaped wheels 84 and the V-grooved blocks 82 may be replaced by a slide mechanism. The materials forming the components may be varied as well.

In an alternate embodiment, the sliding plate 72 can move in grooved slots formed in side wall 50 and in side wall 52 without the aid of V-shaped wheels or a slide mechanism. Also, the minimum and the maximum contact can be varied from the ranges described herein.

As used herein, "solder wave width" describes a cross-sectional dimension of the actual solder wave and "contact length" describes a distance on a PCB that is in contact with the wave at any given point in time. The word "length" as used herein references contact length that is parallel to the direction of travel of the PCB.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A wave soldering machine to perform a wave soldering operation on a printed circuit board, the wave soldering machine comprising:
    a housing;
    a conveyor coupled to the housing, the conveyor being configured to deliver a printed circuit board through the housing;
    a wave soldering station coupled to the housing, the wave soldering station including a reservoir of solder material, and a wave solder nozzle assembly configured to create a solder wave, the conveyor being configured to travel over the solder wave along a direction of travel to perform a wave solder operation, the wave solder nozzle assembly having a nozzle core frame, a solder distribution baffle secured to the nozzle core frame, and a sliding plate that together define a nozzle, the sliding plate being movable with respect to the nozzle core frame between a proximate position in which the nozzle is configured to produce a reduced solder wave in the direction of travel through the solder distribution baffle and a spaced apart position in which the nozzle is configured to produce an extended solder wave in the direction of travel through the solder distribution baffle,
    wherein the wave solder nozzle assembly further includes
        an unload support frame secured to the nozzle core frame,
        an actuating support frame coupled to the unload support frame and configured to move relative to the unload support frame, the sliding plate being secured to the actuating support frame, and
        an actuator assembly configured to move the actuating support frame, the actuator assembly including an actuator support secured to the reservoir and an actuator secured to and supported by the actuator support.

2. The wave soldering machine of claim 1, wherein the wave solder nozzle assembly further includes V-shaped wheels secured to the actuating support frame and V-grooved blocks secured to the unload support frame, the V-shaped wheels being received within the V-grooved blocks to provide relative movement of the actuating support frame with respect to the unload support frame.

3. The wave soldering machine of claim 1, wherein the actuator assembly further includes a connecting link secured to the actuating support frame and coupled to the actuator.

4. The wave soldering machine of claim 3, wherein the actuator is coupled to a controller to control the movement of the actuator.

5. A wave solder nozzle assembly of a wave soldering station configured to perform a wave soldering operation on a printed circuit board, the wave solder nozzle assembly comprising:
a nozzle core frame;
a solder distribution baffle secured to the nozzle core frame;
a sliding plate, which with the nozzle core frame and the solder distribution baffle together define a nozzle, the sliding plate being movable with respect to the nozzle core frame between a proximate position in which the nozzle is configured to produce a reduced solder wave in a direction of travel of the circuit board through the solder distribution baffle and a spaced apart position in which the nozzle is configured to produce an extended solder wave in the direction of travel through the solder distribution baffle;
an unload support frame secured to the nozzle core frame;
actuating support frame coupled to the unload support frame and configured to move relative to the unload support frame, the sliding plate being secured to the actuating support frame; and
an actuator assembly configured to move the actuating support frame, the actuator assembly including an actuator support secured to the reservoir and an actuator secured to and supported by the actuator support.

6. The wave solder nozzle assembly of claim 5, further comprising V-shaped wheels secured to the actuating support frame and V-grooved blocks secured to the unload support frame, the V-shaped wheels being received within the V-grooved blocks to provide relative movement of the actuating support frame with respect to the unload support frame.

7. The wave solder nozzle assembly of claim 5, wherein the actuator assembly further includes a connecting link secured to the actuating support frame and coupled to the actuator.

8. The wave solder nozzle assembly of claim 7, wherein the actuator is coupled to a controller to control the movement of the actuator.

9. A method of adjusting a solder wave of a wave solder nozzle assembly of a wave soldering machine, the method comprising:
delivering solder material to a wave solder nozzle assembly including a solder distribution baffle;
adjusting a solder wave with the wave solder nozzle assembly in a direction of travel of a circuit board over the solder wave with a sliding plate movable with respect to the solder distribution baffle; and
performing a wave soldering operation on a printed circuit board,
wherein adjusting a solder wave is achieved by moving the sliding plate of the wave solder nozzle assembly with respect to a nozzle core frame supporting the solder distribution baffle between a proximate position to produce a reduced solder wave in the direction of travel through the solder distribution baffle and a spaced apart position to produce an extended solder wave in the direction of travel through the solder distribution baffle, and
wherein the movement of the sliding plate is achieved by an actuator assembly configured to move an actuating support frame coupled to the sliding plate.

10. The method of claim 9, wherein the actuator is coupled to a controller to control the movement of the actuator.

* * * * *